(12) United States Patent
Fragapane

(10) Patent No.: US 12,707,673 B2
(45) Date of Patent: Aug. 11, 2026

(54) SILICON CARBIDE INTEGRATED DEVICE AND METHOD FOR MANUFACTURING AN INTEGRATED DEVICE

(71) Applicant: STMICROELECTRONICS S.r.l., Agrate Brianza (IT)

(72) Inventor: Leonardo Fragapane, Catania (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 459 days.

(21) Appl. No.: 18/506,777

(22) Filed: Nov. 10, 2023

(65) Prior Publication Data

US 2024/0170568 A1 May 23, 2024

(30) Foreign Application Priority Data

Nov. 22, 2022 (IT) ........................ 102022000023976

(51) Int. Cl.

*H10D 30/66* (2025.01)
*H10D 12/01* (2025.01)
*H10D 30/65* (2025.01)
*H10D 62/832* (2025.01)
*H10D 64/00* (2025.01)

(52) U.S. Cl.

CPC ......... *H10D 30/665* (2025.01); *H10D 12/031* (2025.01); *H10D 30/655* (2025.01); *H10D 62/8325* (2025.01); *H10D 64/111* (2025.01)

(58) Field of Classification Search

CPC .. H10D 30/665; H10D 12/031; H10D 30/655; H10D 62/8325; H10D 64/111; H10D 62/106; H10D 62/126; H10D 84/84

See application file for complete search history.

(56) References Cited

U.S. PATENT DOCUMENTS

2015/0372007 A1 12/2015 Hashimoto et al.
2015/0372075 A1* 12/2015 Fragapane ........... H10D 62/109 257/493
2022/0238643 A1 7/2022 Drowley et al.
2022/0293746 A1 9/2022 Du

FOREIGN PATENT DOCUMENTS

JP 2011187767 A 9/2011

* cited by examiner

*Primary Examiner* — Fernando L Toledo
*Assistant Examiner* — Shawn Shaw Muslim
(74) *Attorney, Agent, or Firm* — Seed Intellectual Property Law Group LLP

(57) ABSTRACT

An integrated device includes: a semiconductor structural layer, including silicon carbide and having a first conductivity type; a power device integrated in the structural layer; and an edge termination structure, extending in a ring around the power device and having a second conductivity type. The edge termination structure includes a plurality of ring structures each arranged around the power device and in contiguous pairs. At least a first one of the ring structures comprises a transition region contiguous to a second one of the ring structures. The transition region includes connection regions, having the second conductivity type, connected to the second one of the ring structures and alternating with charge control regions having the first conductivity type.

20 Claims, 7 Drawing Sheets

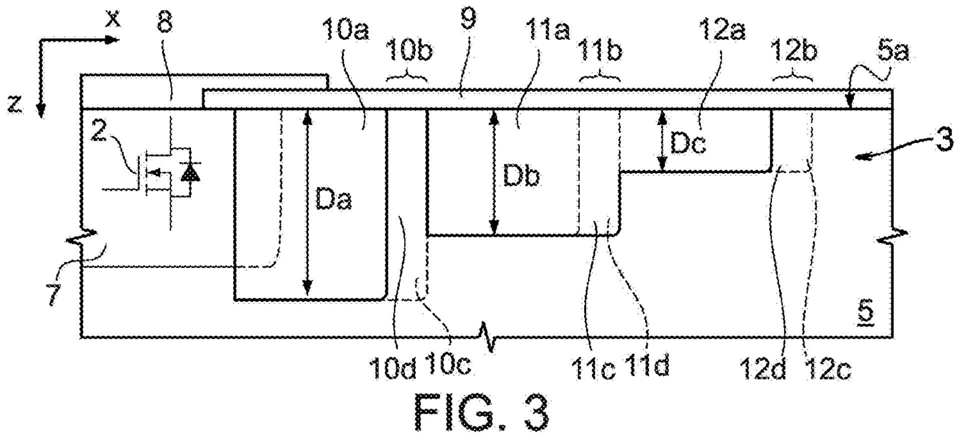
FIG. 3
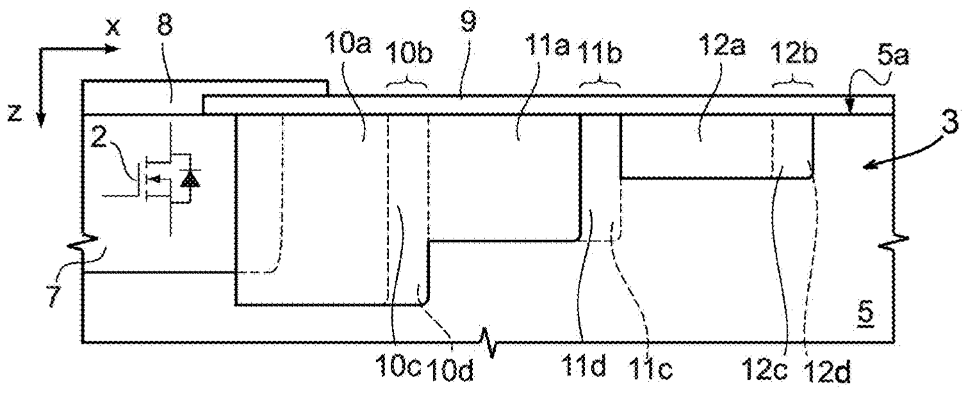
FIG. 4
10c
10d
10c
9
10d
10c
5a
x
z
5
FIG. 5
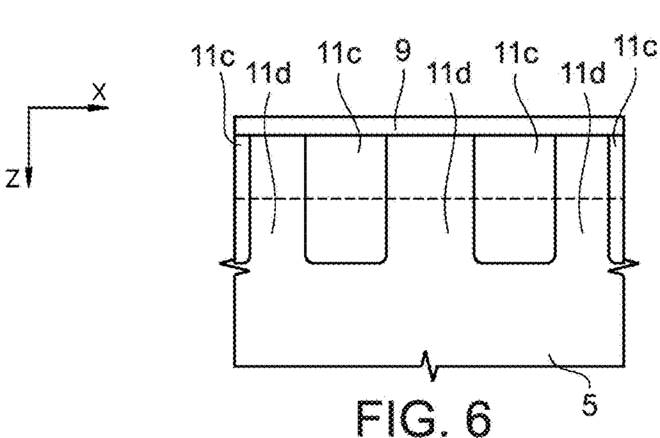
FIG. 6

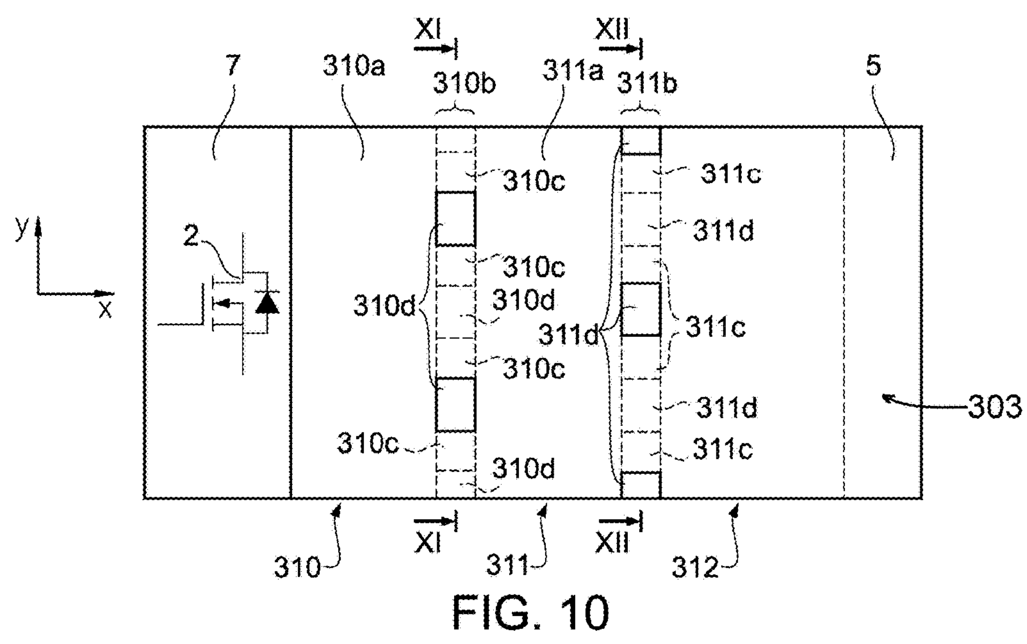
FIG. 10
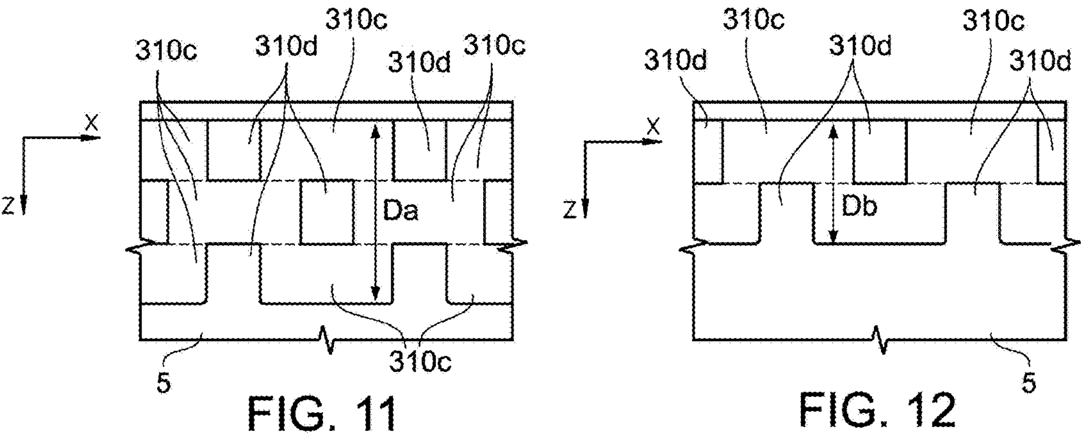
FIG. 11
FIG. 12
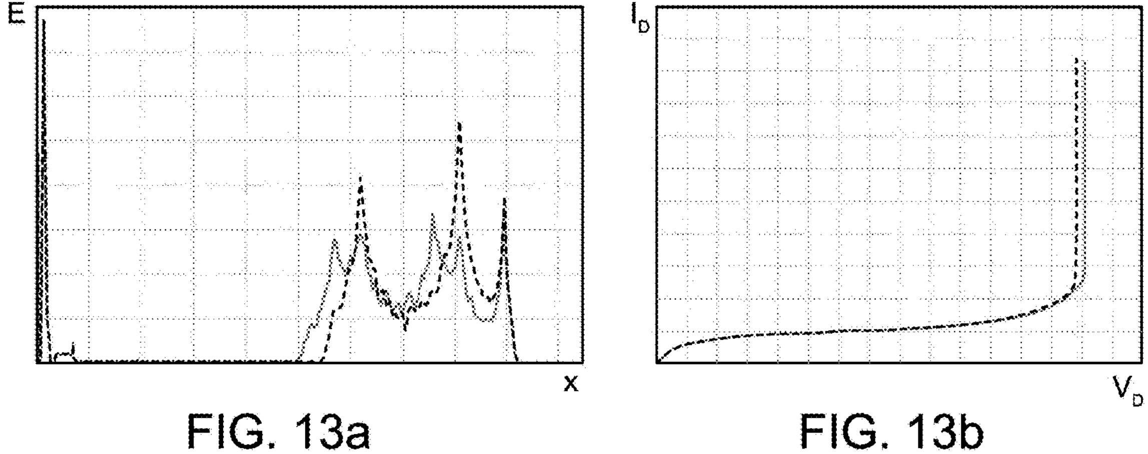
FIG. 13a
FIG. 13b

SILICON CARBIDE INTEGRATED DEVICE AND METHOD FOR MANUFACTURING AN INTEGRATED DEVICE

BACKGROUND

Technical Field

The present disclosure relates to a silicon carbide integrated device and to a method for manufacturing an integrated device.

Description of the Related Art

As is known, Silicon Carbide (SiC) has advantageous electrical properties, such as high band gap, high critical electric field and high thermal conductivity, which make its use particularly promising for high-power, high-voltage, fast-switching and high-operating temperature applications.

It is also known that, in the edge termination structure, the maximum theoretical value of the breakdown voltages of the integrated power devices is limited by the so-called potential lines crowding effect, which occurs both in the case of devices formed in a silicon substrate, and in devices formed in a silicon carbide substrate. The development of an effective edge termination structure, which allows reaching a breakdown voltage close to the theoretical values, is beneficial in the design of integrated power devices.

Several solutions of edge termination structures have been proposed, intended to mitigate edge effects. In general, the proposed techniques aim at modifying the distribution of the electric field at the periphery of the main junction of the integrated power device, so as to reduce the peak value of the surface electric field. Some of these solutions have also been implemented in the field of integrated power devices formed in silicon carbide substrates, suitably adapted to take into account the main electrical characteristics of silicon carbide itself; in general, however, the direct transition of edge termination techniques from silicon to silicon carbide is quite problematic, due to the different properties of the two materials and to the resulting different processing techniques and the different electrical behavior.

Among these properties, for example, the reduced diffusivity of the dopants within silicon carbide, compared to silicon, is known.

According to a known solution, for example, a ring region is formed in a silicon or silicon carbide substrate of an integrated power device around a main junction region of the integrated power device. The solution is simple and utilizes a single mask and a single dopant implant to form the ring region, but it does not allow the electric field distribution to be accurately controlled (generally, electric field peaks are found at the boundary of the ring region). It has also been proposed to form a plurality of separate and concentric ring regions, the innermost of which is in contact with the main junction region. The ring regions have variable width, as well as the separation distance between adjacent ring regions is variable. During the design step, the width and the separation distance may be suitably sized to obtain a desired pattern of the electric field at the edge termination structure. The solution allows a better control of the electric field, while maintaining a good easiness in manufacturing. A single mask and a single dopant implant may in fact be sufficient.

According to a further known solution, described in US 2015/0372075 A1, an edge termination structure comprises a plurality of ring portions, each made by a respective doped region which is in turn annular-shaped. Each ring portion has a respective width (or smaller dimension) in the horizontal plane and a respective junction depth in the vertical direction. The ring portions are contiguous and arranged side by side to each other, so as to form a single ring region, that is continuous and seamless. The inner ring portions have greater depth and the outer ring portions have gradually decreasing depth. Furthermore, the ring portions have respective amounts of charge decreasing from the inside out.

The edge termination structure may be formed by successive implants having decreasing depth (or, conversely, having increasing depth) in a structural layer containing silicon carbide (for example a substrate or an epitaxial layer). For example, the deepest part of the innermost ring portion may be formed with a first implant. With a successive implant, less deep, but still sufficient to reach the already-implanted region, one part of the innermost ring portion and one part of the immediately outer ring portion are formed. The part of the inner ring portion formed with the most recent implant is stacked on and in contact with the previously formed part. Successive implants are performed up to reaching the surface of the structural layer. Each implant is shallower and laterally more extended than the previous ones and allows new parts of the already formed inner ring portions and one part of a new outer ring portion to be formed. The edge termination structure thus obtained has a stepped profile which approximates an ideal profile degrading in a regular manner towards the periphery, for example a parabolic profile. The electric field control is generally improved, however the steps at the transitions between adjacent ring portions cause electric field peaks that have such amplitude as to create stress in the surface oxides. Although the values of the breakdown voltages may initially be satisfactory, the stress due to the electric field peaks may induce premature aging and compromise the reliability of the devices.

On the other hand, the limits of the lithographic techniques used to define the masks and the number of implants do not allow the widths of the steps to be reduced beyond a certain limit, which may not be sufficient.

In general, none of the known edge termination structures are therefore optimized for use in integrated power devices formed in silicon carbide substrates.

BRIEF SUMMARY

The aim of the present disclosure is to provide an integrated device and a method for manufacturing an integrated device which allow the limitations described to be overcome or at least mitigated. According to the present disclosure an integrated device and a method for manufacturing an integrated device are provided. The integrated device includes a semiconductor structural layer, including silicon carbide and having a first conductivity type, a power device integrated in the structural layer, and an edge termination structure, extending in a ring around the power device and having a second conductivity type. The edge termination structure comprises a plurality of ring structures each arranged around the power device and in contiguous pairs, wherein at least a first one of the ring structures comprises a transition region contiguous to a second one of the ring structures and wherein the transition region includes connection regions, having the second conductivity type, connected to the second one of the ring structures and alternated with charge control regions having the first conductivity type.

BRIEF DESCRIPTION OF THE SEVERAL VIEWS OF THE DRAWINGS

For a better understanding of the present disclosure, some embodiments thereof will now be described, purely by way of non-limiting example and with reference to the attached drawings, wherein:

FIG. 3 is a cross-section through the integrated device of FIGS. 1 and 2, taken along line III-III of FIG. 2;

FIG. 4 is a cross-section through the integrated device of FIGS. 1 and 2, taken along line IV-IV of FIG. 2;

FIG. 5 is a cross-section through the integrated device of FIGS. 1 and 2, taken along line V-V of FIG. 2;

FIG. 6 is a cross-section through the integrated device of FIGS. 1 and 2, taken along line VI-VI of FIG. 2;

FIG. 10 is a top-plan view, with parts removed for clarity, of a detail of an integrated device in accordance with a further embodiment of the present disclosure;

FIG. 11 is a cross-section through the integrated device of FIG. 10, taken along line XI-XI of FIG. 10;

FIG. 12 is a cross-section through the integrated device of FIG. 10, taken along line XII-XII of FIG. 10;

FIGS. 13*a* and 13*b* are graphs showing quantities relating to the integrated device of FIG. 10;

DETAILED DESCRIPTION

Figure 1:
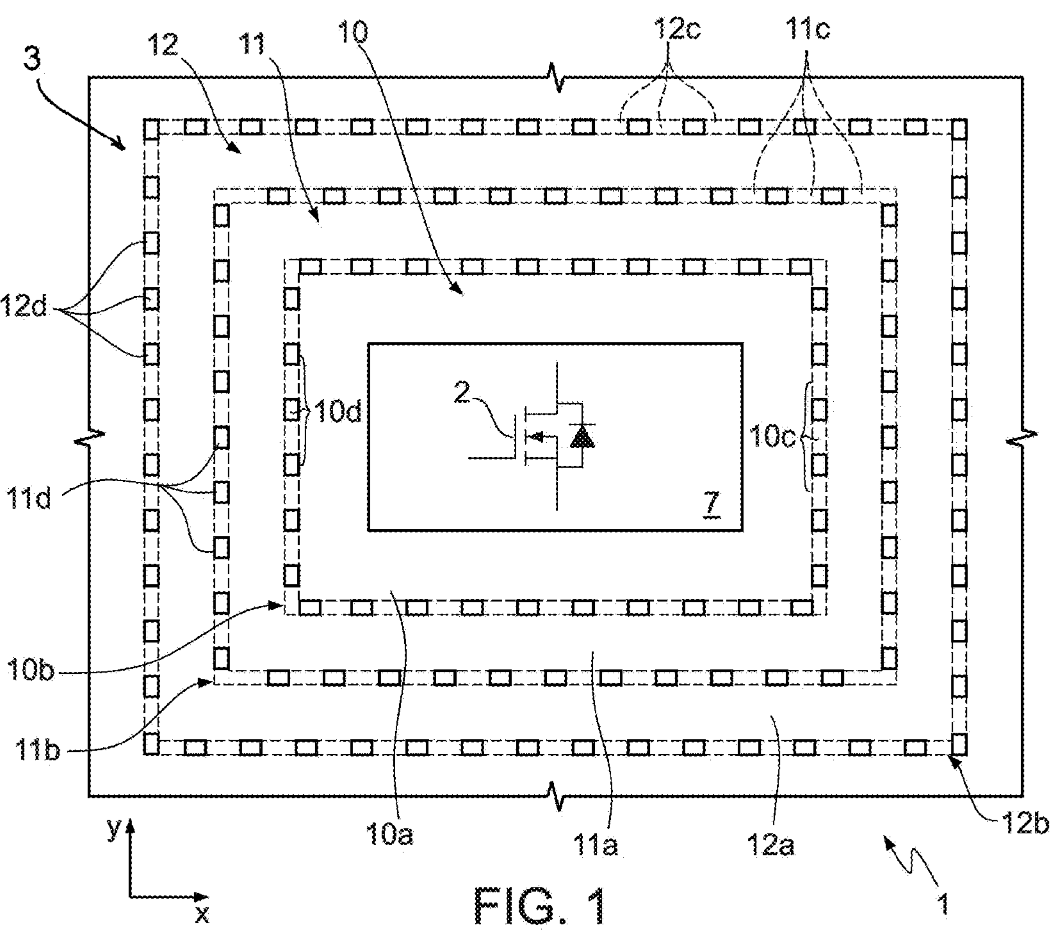
FIG. 1 is a top-plan view, with parts removed for clarity, of an integrated device in accordance with an embodiment of the present disclosure.
Figure 2:
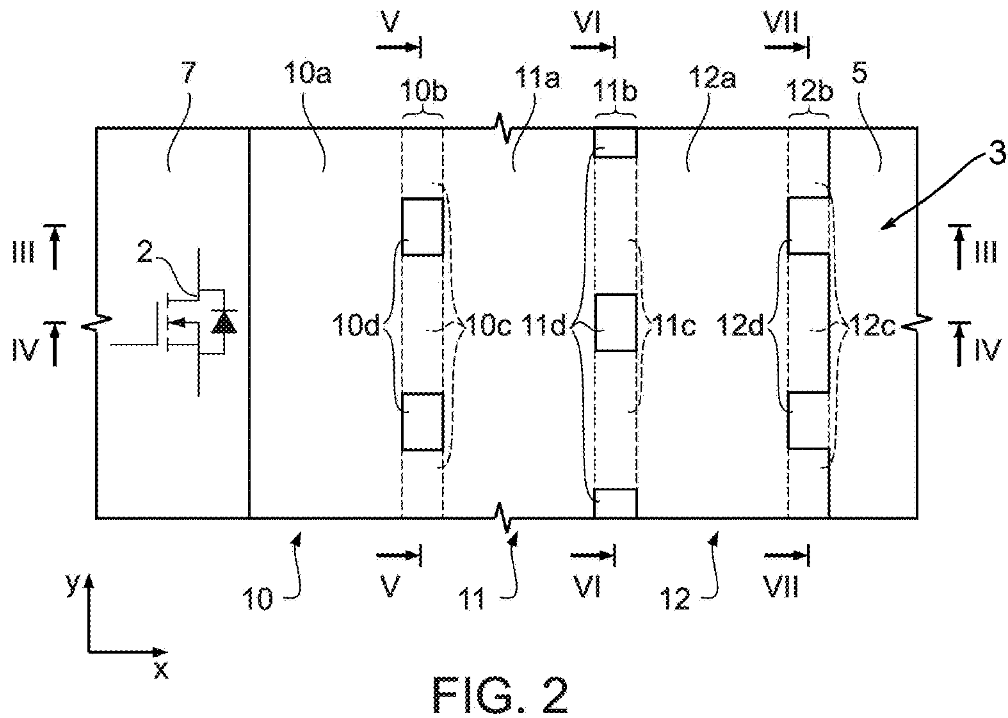
FIG. 2 shows an enlarged detail of the integrated device of FIG. 1.
Figure 7:
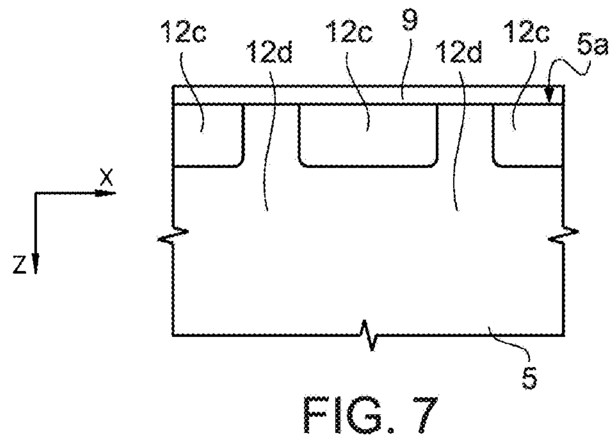
FIG. 7 is a cross-section through the integrated device of FIGS. 1 and 2, taken along line VII-VII of FIG. 2.

With reference to FIGS. 1-7, a semiconductor integrated device, indicated as a whole with the number 1, comprises a power device 2 and an edge termination structure 3, which surrounds the power device 2. More precisely, the integrated device 1 comprises a semiconductor structural layer 5 (better visible in FIGS. 3 and 4), for example a substrate or an epitaxial layer, containing silicon carbide; the power device 2 and the edge termination structure 3 are formed in the structural layer 5.

The structural layer 5 has a front face 5*a* (FIGS. 3 and 4) arranged in an xy plane and has a first doping type and a first conductivity type, for example of N-type.

In a non-limiting example, the power device 2 is a SiC MOSFET and has functional regions 7 (one of which is visible in FIGS. 3 and 4) in a peripheral portion, in contact with the edge termination structure 3. The functional regions 7 have a second doping type and a second conductivity type, here P-type, and form PN junctions with the structural layer 5. The functional regions 7, for example body wells, are generically peripheral structures of the power device 2 and may have a role in generating current or in insulating parts of the same power device 2.

A metal structure 8, so-called "field plate" structure, extends on the structural layer 5 (FIGS. 3 and 4) and is placed directly in contact with the functional region 7. The metal structure 8 is also separated from the edge termination structure 3 by a field plate oxide 9.

The edge termination structure 3 has an annular shape (FIG. 1) and surrounds the functional region 7. Here and in the following, it is understood that an annular structure or region generically extends along a closed, not necessarily circular, path. For example, the edge termination structure 3 may be rectangular, as in the embodiment of FIGS. 1-7, generally polygonal or rectangular elliptical.

In detail, the edge termination structure 3 comprises a plurality of concentric and contiguous ring structures, each having a respective continuous annular region. Furthermore, at least one of the ring structures has a transition region which is also of annular shape, extending around the respective continuous annular region and in contact with the continuous annular region of the immediately outer ring structure.

In the embodiment of FIGS. 1-7, the edge termination structure 3 comprises three ring structures, more precisely an inner ring structure 10, an intermediate ring structure 11 and an outer ring structure 12.

The ring structures 10-12 extend from the front face 5*a* towards the inside of the structural layer 5, each up to a respective depth. The depths of the ring structures 10-12 degrade towards the outside. More precisely, the inner ring structure 10 extends up to a maximum depth Da and the outer ring structure 12 extends up to a minimum depth Dc, while the intermediate ring structure 11 extends up to an intermediate depth Db, comprised between the maximum depth Da and the minimum depth Dc.

Each ring structure 10-12 comprises a respective inner continuous annular region 10*a*-12*a* and a respective transition region 10*b*-12*b* around the respective continuous annular region 10*a*-12*a*. The transition regions 10*b*-12*b* in turn comprise respective connection regions 10*c*-12*c* alternated with charge control regions 10*d*-12*d* along the perimeter of the respective continuous annular regions 10*a*-12*a*. The continuous annular regions 10*a*-12*a* and the connection regions 10*c*-12*c* have the second doping type and the second conductivity type (P-type in the described embodiment). The charge control regions 10*d*-12*d* have the same doping type and level and the same conductivity type as the structural layer 5 (first doping type and first conductivity type). In practice, as will be seen in detail hereinafter, the continuous annular regions 10*a*-12*a* and the connection regions 10*c*-12*c* are obtained by dopant implants in the structural layer 5, while the charge control regions 10*d*-12*d* are portions of the structural layer 5 preserved by the implants and therefore not modified during the process.

In detail, towards the inside, the continuous annular region 10*a* of the inner ring structure 10 is contiguous to the functional region 7. The transition region 10*b* is arranged around the continuous annular region 10*a* and is contiguous to the continuous annular region 11*a* of the intermediate ring structure 11. The transition region 10*b* comprises a plurality of connection regions 10*c* alternated with a plurality of charge control regions 10*d*. The connection regions 10*c* join the continuous annular region 10*a* of the inner ring structure 10 to the continuous annular region 11*a* of the intermediate ring structure 11. In the embodiment of FIGS. 1-7, the charge control regions 10*d* of the inner ring structure 10 extend continuous and straight from the front face 5*a* of the structural layer 5 up to the maximum depth Da of the same inner ring structure 10 (more precisely, of its continuous annular region 10*a* and its connection regions 10*c*).

The continuous annular region 11*a* of the intermediate ring structure 11 is arranged around the transition region 10*b* of the inner ring structure 10. The transition region 11*b* is arranged around the continuous annular region 11*a* and is contiguous to the continuous annular region 12*a* of the outer ring structure 12. The transition region 11*b* comprises a plurality of connection regions 11*c* and a plurality of charge control regions 11*d*, which join the continuous annular region 11*a* of the intermediate ring structure 11 to the continuous annular region 12*a* of the outer ring structure 12. In the embodiment of FIGS. 1-7, the charge control regions 11*d* of the intermediate ring structure 11 extend continuous and straight from the front face 5*a* of the structural layer 5 up to the intermediate depth Db of the same intermediate ring structure 11 (more precisely, of its continuous annular region 11*a* and its connection regions 11*c*).

The continuous annular region 12*a* of the outer ring structure 12 is arranged around the transition region 11*b* of the intermediate ring structure 11. The transition region 12*b* is optional. If present, as in the embodiment of FIGS. 1-7, the transition region 12*b* is arranged around the continuous annular region 12*a* and is contiguous to the structural layer 5. The transition region 12*b* comprises a plurality of connection regions 12*c* and a plurality of charge control regions 12*d*, which join the continuous annular region 12*a* of the outer ring structure 12 to the continuous annular region 12*a* of the outer ring structure 12. In the embodiment of FIGS. 1-7, the charge control regions 12*d* of the outer ring structure 12 extend continuous and straight from the front face 5*a* of the structural layer 5 up to the minimum depth Dc of the same outer ring structure 12 (more precisely, of its continuous annular region 12*a* and its connection regions 12*c*).

Figure 8:
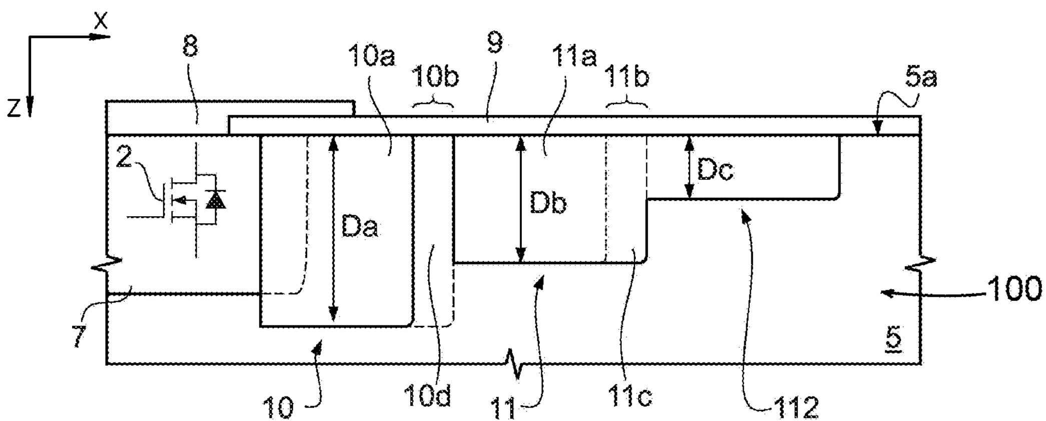
FIG. 8 is a first cross-section through an integrated device in accordance with a different embodiment of the present disclosure.

Transition regions are not necessarily present in all the ring structures and may or may not be included in accordance with design preferences. According to the embodiment of FIG. 8, for example, in an edge termination structure 100 the outer ring structure, here indicated by 112, has no transition region towards the structural layer 5.

The number, the shape and the dimensions of the ring structures forming the edge termination structure may be different from those illustrated in FIGS. 1-7 and may be chosen according to the design preferences. For example, the edge termination structure may comprise only two ring structures, an inner one and an outer one, with the inner ring structure provided with a transition region. Optionally, the outer ring structure may also be provided with a transition region. Alternatively, the edge termination structure may comprise an inner ring structure, an outer ring structure and a plurality of concentric intermediate ring structures. Transition regions are also present in at least one of the inner and intermediate ring structures and, optionally, also in the outer ring structure. Furthermore, in case two or more intermediate ring structures are present, each of them extends up to a respective intermediate depth between the maximum depth Da and the minimum depth Dc and the outer ring structures have a shallower depth than the inner ring structures.

Figure 9:
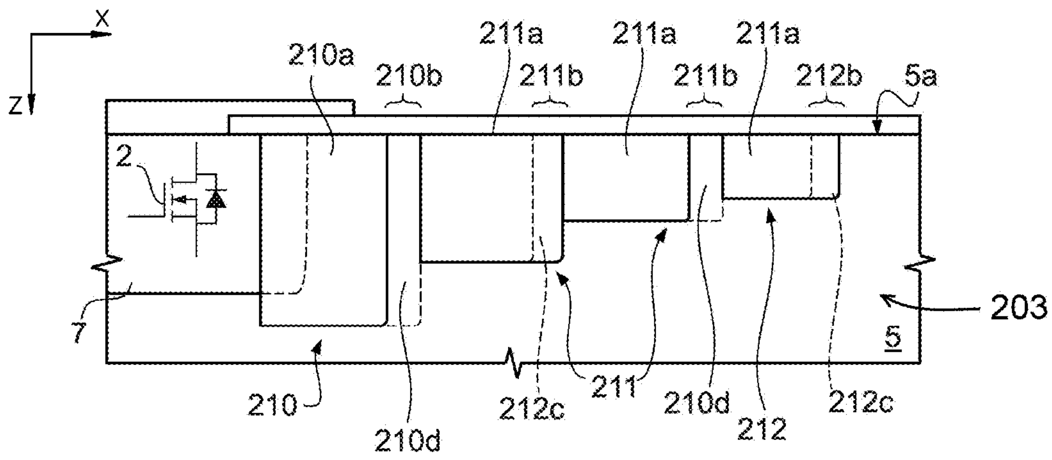
FIG. 9 is a second cross-section through the integrated device of FIG. 8.

In the embodiment of FIG. 9 an integrated device 200 is provided with an edge termination structure 203 which comprises an inner ring structure 210, a plurality of intermediate ring structures 211 (two in the non-limiting example of FIG. 9) and an outer ring structure 212, all concentric and contiguous to each other in pairs. The inner ring structure 210, the intermediate ring structures 211 and the outer ring structure 212 are provided with continuous annular regions, respectively indicated by 210*a*. 211*a*, 212*a*, and with transition regions, substantially as already described and respectively indicated by 210*b*, 211*b*, 212*b*. In particular, the transition regions 210*b*, 211*b*, 212*b* comprise respective continuity regions 210*c*, 211*c*, 212*c* alternated with respective charge control regions 210*d*, 211*d*, 212*d*.

In the embodiments described, the charge control regions 210*d*, 211*d*, 212*d* are columnar in shape and extend from the front face 5*a* towards the inside of the structural layer 5, each up to the depth of the respective ring structure. However, this shape should not be considered limiting.

For example, in the embodiment illustrated in FIGS. 10-12, an edge termination structure 303 formed in the structural layer 5 comprises an inner ring structure 310, an intermediate ring structure 311 and an outer ring structure 312. The inner ring structure 310 and the intermediate ring structure 311 have respective continuous annular regions 310*a*, 311*a* and respective transition regions 310*b*, 311*b*, with connection regions 310*c*, 311*c* alternated with charge control regions 310*d*. 311*d*. The charge control regions 310*d*, 311*d* are defined by islands or blocks, including respective portions of the structural layer 5 and having the same doping and conductivity type as the structural layer 5. Possibly, the charge control regions 310*b*, 311*b* may be connected to the structural layer 5 on one side of the respective ring structures 310, 311 opposite to the front face 5*a*. At least some of the charge control regions 310*d*, 311*d* are located at a distance from the front face 5*a* of the structural layer 5 in the direction of a z axis perpendicular to the xy plane (and therefore to the front face 5*a*) and at least some of the charge control regions 310*d*, 311*d* have a dimension according to the z axis that is smaller than the depth of the respective ring structure 310, 311. Furthermore, the charge control regions 310*d*, 311*d* are distributed in the respective transition regions 310*b*, 311*b* and are arranged offset in the direction of the z axis, for example according to a checkerboard pattern (FIGS. 11 and 12).

In the transition regions, in practice, the charge control regions have the effect of reducing on average the charge density otherwise present in each of the ring structures, at the interface with the adjacent ring structure or, in the case of the outer ring structure, with the structural layer. For example, indicating by Q the local charge density of one of the ring structures, the average charge density Q' in the corresponding transition region is given by:

$$Q'=Q^*\alpha$$

where $\alpha$ is the ratio between the total volume of the connection regions of the transition region (i.e., the sum of the volumes of all connection regions) and the volume of the transition region. The average charge density accounts for the missing charge in the charge control regions: the larger the volume of the charge control regions, the lower the average charge density in the corresponding transition region. The lower average charge density in the transition regions with respect to the continuous annular regions has the effect of reducing the electric field peaks at the interface between adjacent ring structures. The graph of FIG. 13*a* shows the comparison between the electric field in the edge termination structure 100 of FIG. 8 (solid line) and an edge termination structure having ring structures equal in number, shape and dimensions, but with no transition regions (dashed line). The graph of FIG. 13*b* shows the breakdown voltage, which is substantially unchanged in the two cases. The graphs refer to functionally identical devices, with equal epitaxial thicknesses and doping levels and different from each other only for the edge termination structure. As may be seen from the graph of FIG. 13*a*, in the edge termination structure according to the present disclosure, at the interfaces between adjacent ring regions, the electric field has distributed and less intense peaks with respect to the edge termination structure with no transition regions. In practice, the doping profile of the edge termination structure according to the present disclosure better approximates a profile degrading continuously from the inside towards the periphery and is compatible with the definition limits of the lithographic techniques. The reduction of the electric field peaks at the interfaces between adjacent ring structures due to the lower charge density results in less stress for the materials, in particular for the field oxides, and in a lower breakdown probability. The present disclosure therefore allows the reliability of the devices to be safeguarded, preventing premature aging.

A process for manufacturing an integrated device will be described below, in particular referring to the integrated device 1 illustrated in FIGS. 1-7. However, it is understood that the same process, with obvious modifications for example in the layout of the masks and of the implant steps, may substantially be used for any embodiment of the integrated device and especially of the edge termination structure.

Figure 14:
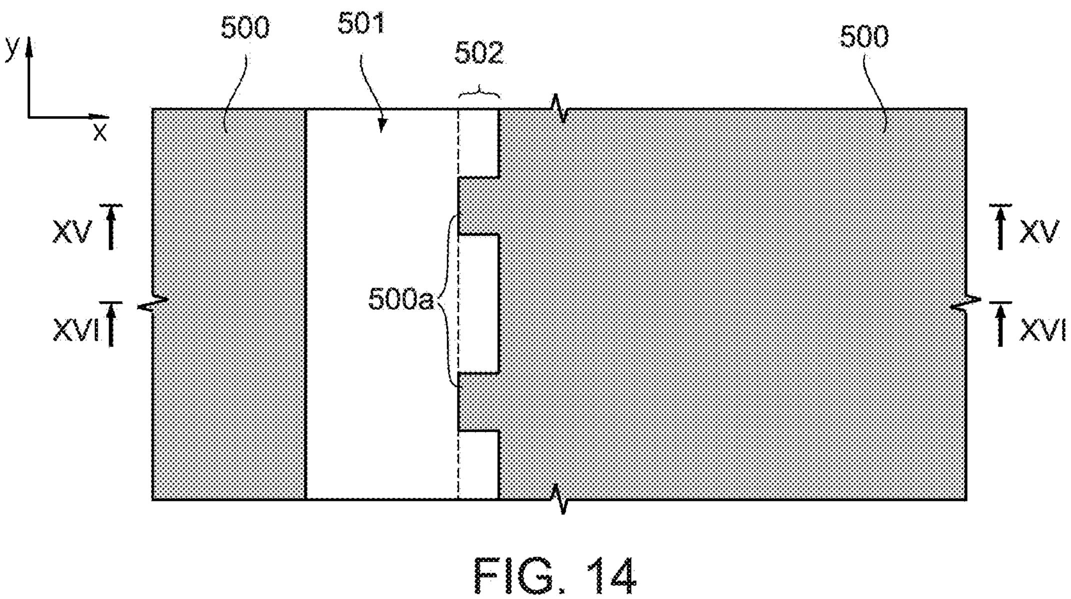
FIG. 14 is a top-plan view of a semiconductor body in an initial step of a method for manufacturing an integrated device in accordance with an embodiment of the present disclosure.
Figure 15:
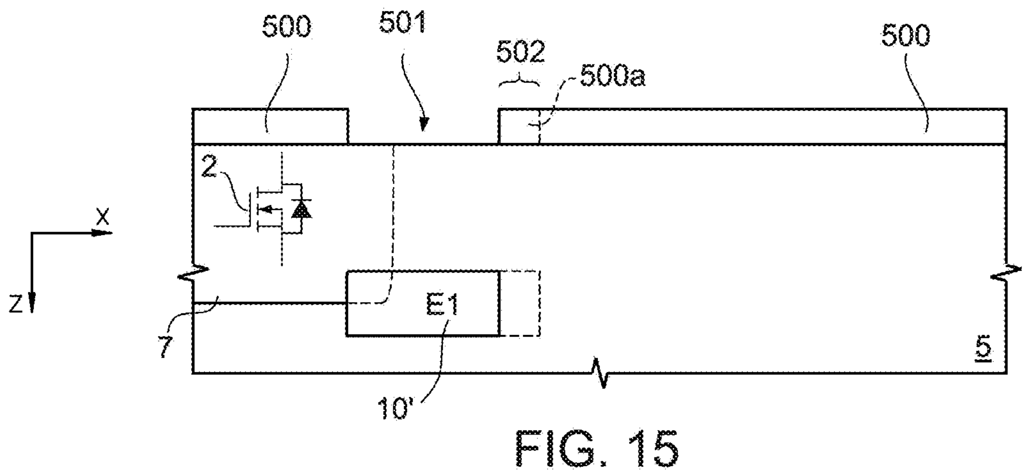
FIG. 15 is a cross-section through the semiconductor body of FIG. 14, taken along line XV-XV of FIG. 14.
Figure 16:
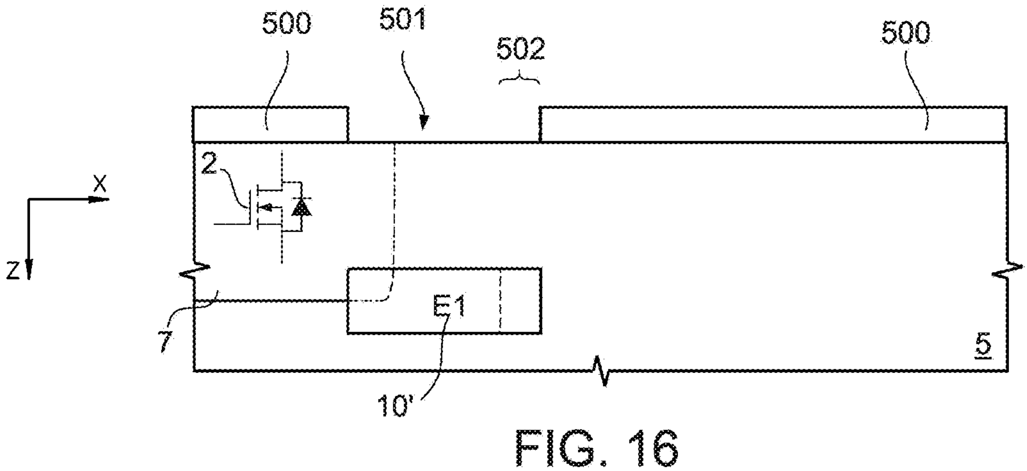
FIG. 16 is a cross-section through the semiconductor body of FIG. 14, taken along line XVI-XVI of FIG. 14.

As shown in FIGS. 14-16, after forming the power device 2 in the functional region 7, a first mask 500 is formed, for example a resist mask obtained by a first photolithographic technique or a silicon oxide or silicon nitride mask. The first mask 500 covers the entire structural layer 5 and leaves exposed a first annular region 501 corresponding to the continuous annular region 10*a* and to the connection regions 10*c* of the inner ring structure 10. The first mask 500 comprises blocks 500*a* in an outer peripheral band 502 of the first annular region 501. In particular, the blocks 500*a* protect zones intended to form charge control regions 10*c* of the inner ring structure 10.

A first implant of a second-type (P) doping species is then performed with a concentration such as to obtain the charge density Q and with a first energy E1 such as to reach the maximum depth Da of the inner ring structure 10. In this manner a first implanted well is formed which forms deep portions 10' of the inner ring structure 10. Within the region of the inner ring structure, portions of the structural layer 5 corresponding to the charge control regions 10*c* are protected from the implant of doping species and maintain the doping type and level of the structural layer 5.

Figure 17:
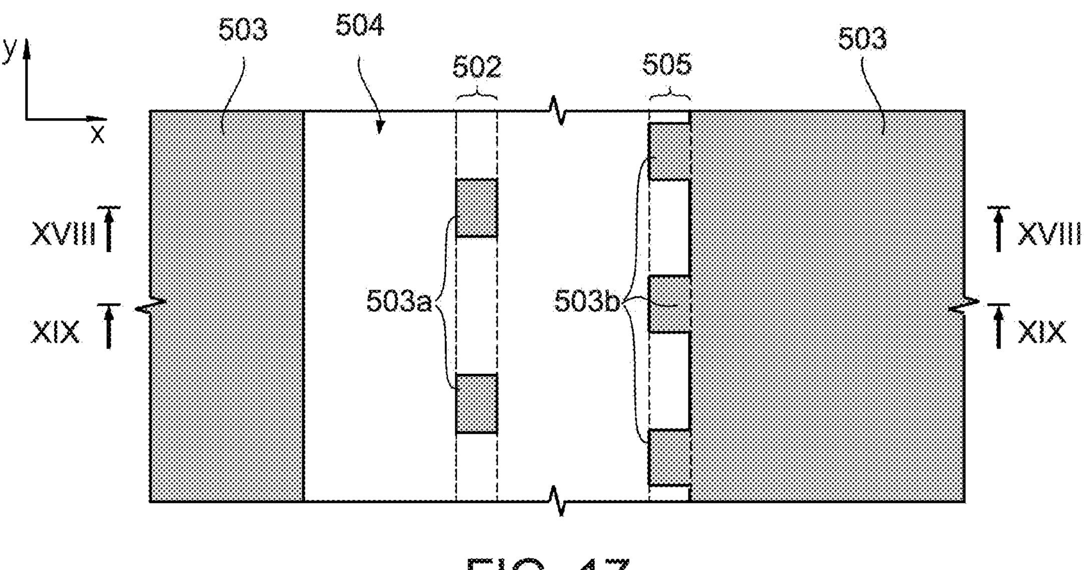
FIG. 17 is a top-plan view of the semiconductor body of FIG. 14 in a successive step of the present method.
Figure 18:
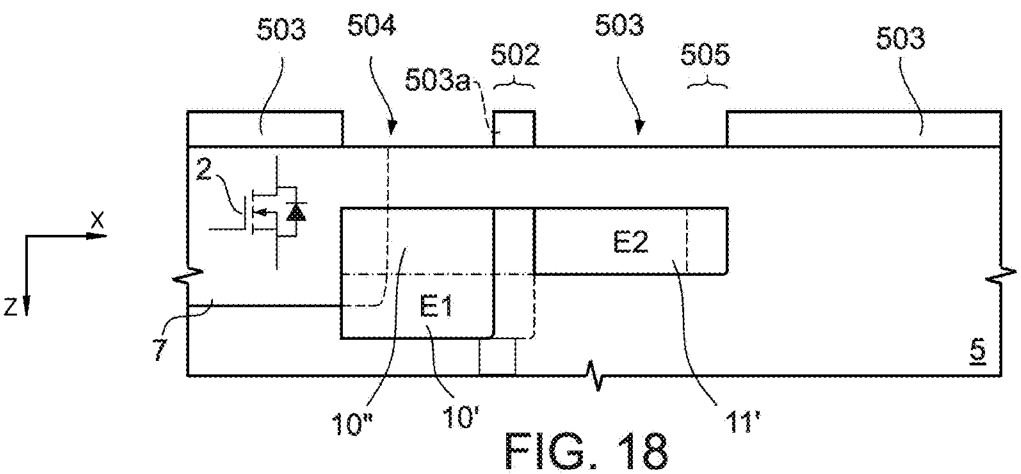
FIG. 18 is a cross-section through the semiconductor body of FIG. 17, taken along line XVIII-XVIII of FIG. 17.
Figure 19:
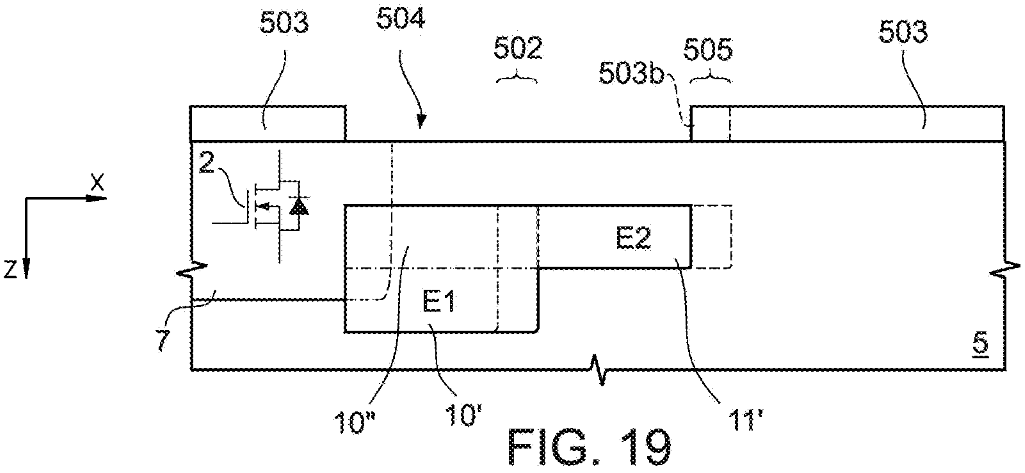
FIG. 19 is a cross-section through the semiconductor body of FIG. 17, taken along line XIX-XIX of FIG. 17.

As shown in FIGS. 17-19, once the implant has been performed, the first mask 500 is removed and in lieu thereof, by a second photolithographic technique, a second mask 503 is formed, for example a resist mask obtained by a second photolithographic technique or a silicon oxide or silicon nitride mask. The second mask 503 covers the functional region 7 and the structural layer 5 and leaves exposed a second annular region 504 corresponding to the continuous annular region 10*a* and to the connection regions 10*c* of the inner ring structure 10 and to the continuous annular region 11*a* and to the connection regions 11*c* of the intermediate ring structure 11. The second mask 503 comprises blocks 503*a* in the band 502 of the first annular region 501 and blocks 503*b* in an outer peripheral band 505 of the second annular region 504. In particular, the blocks 503*a* protect zones intended to form charge control regions 10*c* of the inner ring structure 10 and the blocks 503*b* protect zones intended to form charge control regions 11*c* of the intermediate ring structure 11. The blocks 503*a*, while being within the band 502, are not necessarily in the same positions or in any case aligned with respect to the blocks 500*a* of the first mask 500.

A second implant of the same doping species is performed, with a concentration such as to obtain the charge density Q and with a second energy E2, lower than the first energy E1 and such as to reach the intermediate depth Db of the intermediate ring structure 11. In this manner a second implanted well is formed which, in the region corresponding to the inner ring structure 10, is contiguous to the first implanted well, possibly with a slight overlap to avoid discontinuities in the direction of the z axis. The second implanted well forms portions 10" of the inner ring structure 10 and portions 11' of the intermediate ring structure 11. Portions of the structural layer 5 corresponding to the charge control regions 10*c* in the region of the inner ring structure 10 and to the charge control regions 11*c* in the intermediate ring structure 11 are protected from the implant of doping species and maintain the doping type and level of the structural layer 5.

Figure 20:
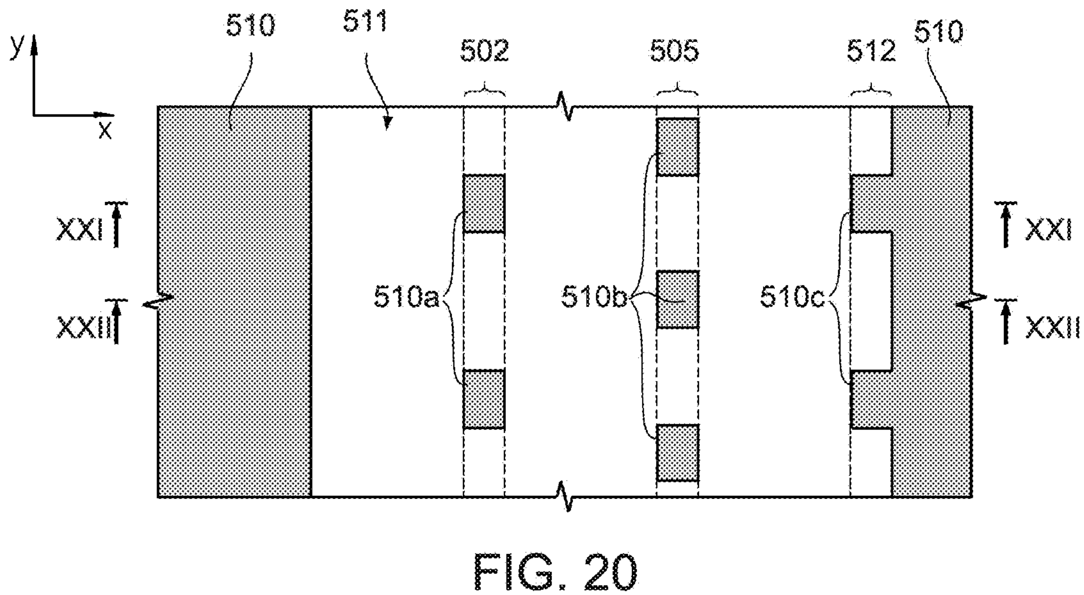
FIG. 20 is a top-plan view of the semiconductor body of FIG. 17 in a further successive step of the present method.
Figure 21:
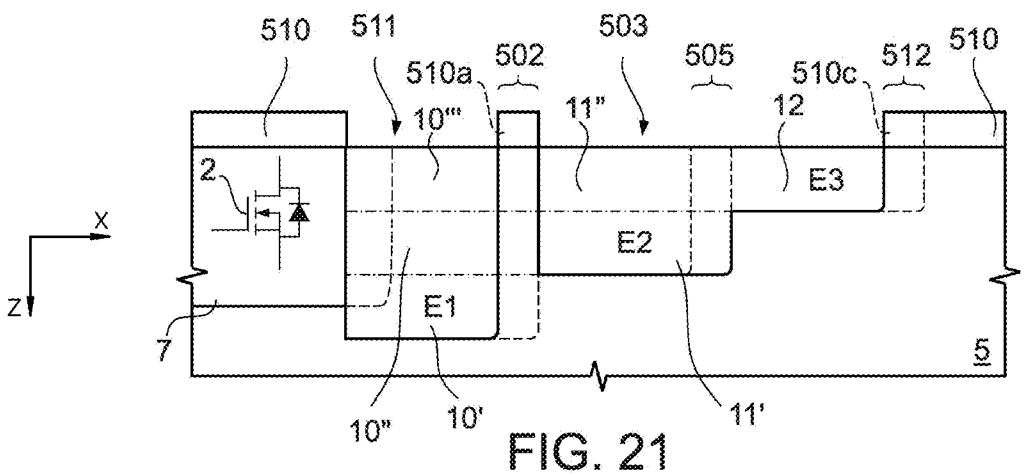
FIG. 21 is a cross-section through the semiconductor body of FIG. 20, taken along line XXI-XXI of FIG. 20.
Figure 22:
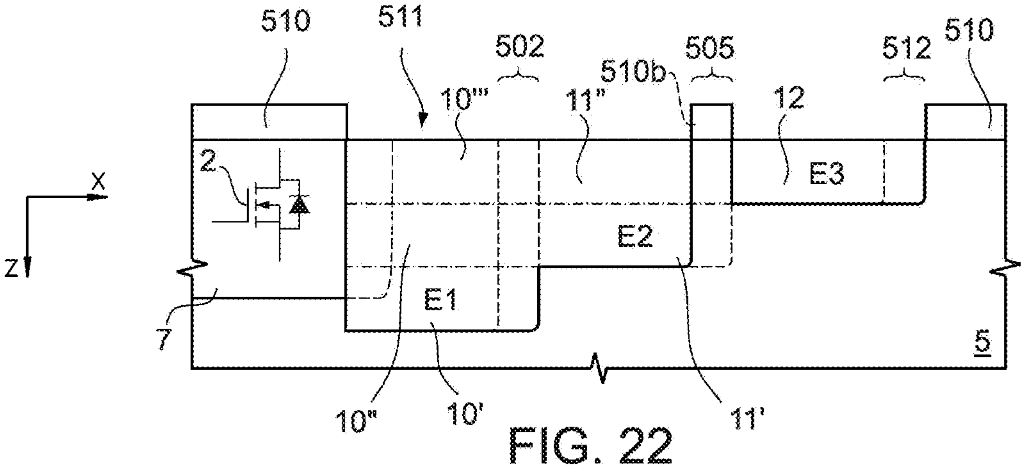
FIG. 22 is a cross-section through the semiconductor body of FIG. 20, taken along line XXII-XXII of FIG. 20.

As shown in FIGS. 20-22, the second mask 503 is then removed and replaced with a third mask 510, for example a resist mask obtained through a third photolithographic technique or a silicon oxide or silicon nitride mask.

The third mask 510 covers the functional region 7 and the structural layer 5 and leaves exposed a third annular region 511 corresponding to the continuous annular region 10*a* and to the connection regions 10*c* of the inner ring structure 10, to the continuous annular region 11*a* and to the connection regions 11*c* of the intermediate ring structure 11 and to the continuous annular region 12*a* and to the connection regions 12*c* of the outer ring structure 12. The third mask 510 comprises blocks 510*a* in the band 502 of the first annular region 501, blocks 510*b* in the band 505 of the second annular region 504 and blocks 510*c* in an outer peripheral band 512 of the second annular region 504. In particular, the blocks 510*a* protect zones intended to form charge control regions 10*c* of the inner ring structure 10, the blocks 510*b* protect zones intended to form charge control regions 11*c* of the intermediate ring structure 11 and the blocks 510*c* protect zones intended to form charge control regions 12*c* of the outer ring structure 12. The blocks 510*a*, 510*b* while being within the respective bands 502, 505, are not necessarily in the same positions or in any case aligned with respect to the blocks 500*a*, 503*a*, 503*b* of the first mask 500 and of the second mask 503.

A third implant of the same doping species is performed, with a concentration such as to obtain the charge density Q and with a third energy E3, lower than the first energy E1 and the second energy E2 such as to reach the minimum depth De of the outer ring structure 12. In this manner, a third implanted well is formed which, in the region corresponding to the intermediate ring structure 11, is contiguous to the second implanted well, possibly with a slight overlap to avoid discontinuities in the direction of the z axis. The third implanted well forms portions 10''' of the inner ring structure 10, portions 11'' of the intermediate ring structure 11 and the entire outer ring structure 12. Portions of the structural layer 5 corresponding to the charge control regions 10*c* in the region of the inner ring structure 10, to the charge control regions 11*c* in the intermediate ring structure 11 are protected from the implant of doping species and maintain the doping type and level of the structural layer 5.

At this point, the edge termination structure 3 is completed and includes the charge control regions 10*c*, 11*c*, 12*c* which, having been preserved from the introduction of the doping species during the implant steps, have the same dopant type and concentration as the structural layer 5.

Finally, terminal processing steps are performed, including forming the field plate oxide 9 on the edge termination structure 3 and forming the metal structure 8. The integrated device 1 of FIGS. 1-7 is thus obtained.

In general, the number of masks and implant steps is equal to the number of ring structures which form the edge termination structure. Each mask has wider openings than the masks used for deeper implants and comprises respective blocks that protect zones of the structural layer intended to form charge control regions in the implanted wells directly formed through the same mask. The masking and implant steps may be performed in the reverse order with respect to that described, i.e., starting from the outermost and most superficial ring structure up to the innermost and deepest one.

If desired, the dopant concentration may vary along the z axis, instead of being constant. In particular, the implant steps may be performed so that the implanted wells have doping species concentrations different from each other.

Finally, it is clear that modifications and variations may be made to the integrated device and to the method described, without departing from the scope of the present disclosure, as defined in the attached claims.

An integrated device (11) may be summarized as including a semiconductor structural layer (5), including silicon carbide and having a first conductivity type; a power device (2) integrated in the structural layer (5); and an edge termination structure (3; 203; 303), extending in a ring around the power device (2) and having a second conductivity type; wherein the edge termination structure (3; 203; 303) comprises a plurality of ring structures (10, 11, 12; 210, 211, 212; 310, 311, 312) each arranged around the power device (2) and in contiguous pairs; wherein at least a first one (10, 11; 210, 211; 310, 311) of the ring structures (10, 11, 12; 210, 211, 212; 310, 311, 312) comprises a transition region (10*b*, 11*b*; 210*b*, 211*b*; 310*b*, 311*b*) contiguous to a second one (11, 12; 211, 212; 311, 312) of the ring structures (10, 11, 12; 210, 211, 212; 310, 311, 312); and wherein the transition region (10*b*, 11*b*; 210*b*, 211*b*; 310*b*, 311*b*) includes connection regions (10*c*, 11*c*; 310*c*, 311*c*), having the second conductivity type, connected to the second one (11, 12; 211, 212; 311, 312) of the ring structures (10, 11, 12; 210, 211, 212; 310, 311, 312) and alternated with charge control regions (10*d*, 11*d*; 310*d*, 311*d*) having the first conductivity type.

The ring structures (10, 11, 12; 210, 211, 212; 310, 311, 312) may include an inner ring structure (10; 210; 310), an outer ring structure (12; 112; 212; 312) and at least one intermediate ring structure (11; 211; 311) between the inner ring structure (10; 210; 310) and the outer ring structure (12; 112; 212; 312).

The ring structures (210, 211, 212) may include a plurality of intermediate ring structures (211) between the inner ring structure (210) and the outer ring structure (212).

The inner ring structure (10; 210; 310) and each intermediate ring structure (11; 211; 311) may include a respective transition region (10*b*, 11*b*; 210*b*, 211*b*; 310*b*, 311*b*) contiguous to the immediately outer ring structure (10, 11, 12; 210, 211, 212; 310, 311, 312) and wherein the respective transition region (10*b*, 11*b*; 210*b*, 211*b*; 310*b*, 311*b*) may include respective connection regions (10*c*, 11*c*; 310*c*, 311*c*), having the second conductivity type, connected to the immediately outer ring structure (10, 11, 12; 210, 211, 212; 310, 311, 312) and alternated with charge control regions (10*d*, 11*d*; 310*d*, 311*d*) having the first conductivity type.

The inner ring structure (10; 210; 310) and each intermediate ring structure (11; 211; 311) may include a respective continuous annular region (10*a*, 11*a*; 210*a*, 211*a*; 310*a*, 311*a*) and the transition regions (10*b*, 11*b*; 210*b*, 211*b*; 310*b*, 311*b*) may extend around the respective continuous annular regions (10*a*, 11*a*; 210*a*, 211*a*; 310*a*, 311*a*).

The connection regions (10*c*, 11*c*; 310*c*, 311*c*) may join the respective continuous annular regions (10*a*, 11*a*; 210*a*, 211*a*; 310*a*, 311*a*) to the respective immediately outer ring structure (10, 11, 12; 210, 211, 212; 310, 311, 312).

The outer ring structure (12; 212) may include a respective transition region (12*b*; 212*b*) externally contiguous to the structural layer (5) and including respective connection regions (12*c*), having the second conductivity type, contiguous to the structural layer (5) and alternating with charge control regions (12*d*) having the first conductivity type.

The outer ring structure (12; 212) may include a respective continuous annular region (12*c*; 210*a*, 211*a*) and the respective transition region (12*b*; 212*b*) may extend around the respective continuous annular region (12*c*; 210*a*, 211*a*).

The charge control regions (10*d*, 11*d*; 310*d*, 311*d*) may be defined by respective portions of the structural layer (5).

The structural layer (5) may have a front face (5*a*) and the ring structures (10, 11, 12; 210, 211, 212; 310, 311, 312) may extend from the front face (5*a*) towards the inside of the structural layer (5) up to respective distinct depths (Da; Db; Dc) decreasing towards the outside of the edge termination structure (3; 203; 303).

The charge control regions (10*d*, 11*d*) may extend straight from the front face (5*a*) of the structural layer (5) up to the depth (Da; Db; Dc) of the respective ring structure (10, 11, 12; 210, 211, 212).

At least some of the charge control regions (310*d*, 311*d*) may be located at a distance from the front face (5*a*) of the structural layer (5) in a direction perpendicular to the front face (5*a*) and at least some of the charge control regions (310*d*, 311*d*) may have, in the direction perpendicular to the front face (5*a*), a dimension smaller than the depth (Da, Db) of the respective ring structure (310, 311).

The power device (2) may include a peripheral functional region (7), having the second conductivity type, and the edge termination structure (3; 203; 303) is contiguous to the functional region (7).

A method for manufacturing an integrated device may be summarized as including forming a power device (2) in a semiconductor structural layer containing silicon carbide having a first conductivity type; forming an edge termination structure (3; 203; 303), extending in a ring around the power device (2) and having a second conductivity type; wherein forming the edge termination structure (3; 203; 303) comprises: forming a plurality of ring structures (10, 11, 12; 210, 211, 212; 310, 311, 312) each arranged around the power device (2) and in contiguous pairs; forming, in at least a first one (10, 11; 210, 211; 310, 311) of the ring structures (10, 11, 12; 210, 211, 212; 310, 311, 312), a transition region (10*b*, 11*b*; 210*b*, 211*b*; 310*b*, 311*b*) contiguous to a second one (11, 12; 211, 212; 311, 312) of the ring structures (10, 11, 12; 210, 211, 212; 310, 311, 312); and forming, in the transition region (10*b*, 11*b*; 210*b*, 211*b*; 310*b*, 311*b*), connection regions (10*c*, 11*c*; 310*c*, 311*c*), having the second conductivity type, connected to the second one (11, 12; 211, 212; 311, 312) of the ring structures (10, 11, 12; 210, 211, 212; 310, 311, 312) and alternated with charge control regions (10*d*. 11*d*; 310*d*. 311*d*) having the first conductivity type.

Forming the connection regions (10*c*, 11*c*; 310*c*, 311*c*) alternated with the charge control regions (10*d*, 11*d*; 310*d*, 311*d*) may include implanting a doping species into the structural layer (5) and protecting the charge control regions (10*d*-12*d*) from the implants.

Implanting may include sequentially performing a plurality of implants of the doping species at respective distinct depths; wherein performing each implant of the plurality of implants may include forming a respective mask (500, 503, 510) and implanting the doping species through the respective mask (500, 503, 510) at the respective depth; wherein the mask (500, 503, 510) of each implant may be configured to expose portions of the structural layer (5) wider with respect to portions of the structural layer (5) exposed by the masks (500, 503, 510) of the deeper implants; and wherein each mask (500, 503, 510) may include respective blocks (500*a*, 503*a*, 510*a*) in positions corresponding to respective charge control regions (10*d*, 11*d*; 310*d*, 311*d*).

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated device, comprising:

a semiconductor structural layer, including silicon carbide and having a first conductivity type;

a power device integrated in the structural layer; and an edge termination structure, extending in a ring around the power device and having a second conductivity type;

wherein the edge termination structure comprises a plurality of ring structures each around the power device and in contiguous pairs;

wherein at least a first one of the ring structures comprises a transition region contiguous to a second one of the ring structures; and wherein the transition region includes connection regions, having the second conductivity type, coupled to the second one of the ring structures and alternated with charge control regions having the first conductivity type.

2. The device according to claim 1, wherein the ring structures comprise an inner ring structure, an outer ring structure and at least one intermediate ring structure between the inner ring structure and the outer ring structure.

3. The device according to claim 2, wherein the ring structures comprise a plurality of intermediate ring structures between the inner ring structure and the outer ring structure.

4. The device according to claim 2, wherein the inner ring structure and each intermediate ring structure comprise a respective transition region contiguous to the immediately outer ring structure and wherein each respective transition region includes respective connection regions, having the second conductivity type, coupled to the immediately outer ring structure and alternated with charge control regions having the first conductivity type.

5. The device according to claim 2, wherein the inner ring structure and each intermediate ring structure comprise a respective continuous annular region and the transition regions extend around the respective continuous annular regions.

6. The device according to claim 5, wherein the connection regions join the respective continuous annular regions to the respective immediately outer ring structure.

7. The device according to claim 2, wherein the outer ring structure comprises a respective transition region externally contiguous to the structural layer and including respective connection regions, having the second conductivity type, contiguous to the structural layer and alternating with charge control regions having the first conductivity type.

8. The device according to claim 2, wherein the outer ring structure comprises a respective continuous annular region and the respective transition region extends around the respective continuous annular region.

9. The device according to claim 1, wherein the charge control regions are defined by respective portions of the structural layer.

10. The device according to claim 1, wherein the structural layer has a front face and the ring structures extend from the front face towards the inside of the structural layer up to respective distinct depths decreasing towards the outside of the edge termination structure.

11. The device according to claim 10, wherein the charge control regions extend straight from the front face of the structural layer up to the depth of the respective ring structure.

12. The device according to claim 10, wherein at least some of the charge control regions are located at a distance from the front face of the structural layer in a direction perpendicular to the front face and at least some of the charge control regions have, in the direction transverse to the front face, a dimension smaller than the depth of the respective ring structure.

13. The device according to claim 1, wherein the power device comprises a peripheral functional region, having the second conductivity type, and the edge termination structure is contiguous to the functional region.

14. A method for manufacturing an integrated device, comprising:

forming a power device in a semiconductor structural layer containing silicon carbide having a first conductivity type;

forming an edge termination structure, extending in a ring around the power device and having a second conductivity type;

wherein forming the edge termination structure comprises:

forming a plurality of ring structures each arranged around the power device and in contiguous pairs;

forming, in at least a first one of the ring structures, a transition region contiguous to a second one of the ring structures; and forming, in the transition region, connection regions, having the second conductivity type, coupled to the second one of the ring structures and alternated with charge control regions having the first conductivity type.

15. The method according to claim 14, wherein forming the connection regions alternated with the charge control regions comprises implanting a doping species into the structural layer and protecting the charge control regions from the implants.

16. The method according to claim 15, wherein implanting the doping species comprises sequentially performing a plurality of implants of the doping species at respective distinct depths;

wherein performing each implant of the plurality of implants comprises forming a respective mask and implanting the doping species through the respective mask at the respective depth;

wherein the mask of each implant is configured to expose portions of the structural layer wider with respect to portions of the structural layer exposed by the masks of the deeper implants; and wherein each mask comprises respective blocks in positions corresponding to respective charge control regions.

17. A device, comprising:

a structural layer having a first surface opposite a second surface;

a power device in the structural layer; and an edge termination structure in the structural layer and surrounding the power device, the edge termination structure including:

a first ring structure extending a first depth from the first surface toward the second surface, the first ring structure having a first annular region and a first transition region; and a second ring structure between the first annular region of the first ring structure and the power device, the second ring structure extending a second depth that is greater than the first depth from the first surface toward the second surface, the second ring structure including a second transition region comprising a plurality of connection regions having a first conductivity type alternated with a plurality of charge control regions having a second conductivity type that is different from the first conductivity type.

18. The device of claim 17, wherein the edge termination structure comprises a third ring structure between the first annular region of the first ring structure and the transition region of the second ring structure, the third ring structure extending a third depth from the first surface toward the second surface that is greater than the first depth and smaller than the second depth.

19. The device of claim 17, comprising a field plate structure on the first surface and a field plate oxide between the field plate structure and the second ring structure.

20. The device of claim 19, wherein the power device has a functional region having the first conductivity type and the field plate structure is coupled directly to the functional region.

* * * * *